United States Patent
Yoo

(10) Patent No.: US 9,899,541 B2
(45) Date of Patent: Feb. 20, 2018

(54) SEMICONDUCTOR DEVICES

(71) Applicant: Samsung Electronics Co., Ltd., Suwon-si, Gyeonggi-do (KR)

(72) Inventor: Jae-Hyun Yoo, Suwon-Si (KR)

(73) Assignee: Samsung Electronics Co., Ltd. (KR)

(*) Notice: Subject to any disclaimer, the term of this patent is extended or adjusted under 35 U.S.C. 154(b) by 54 days.

(21) Appl. No.: 14/714,405

(22) Filed: May 18, 2015

(65) Prior Publication Data

US 2016/0035905 A1 Feb. 4, 2016

(30) Foreign Application Priority Data

Jul. 31, 2014 (KR) .................. 10-2014-0098341

(51) Int. Cl.
| | | |
|---|---|---|
| *H01L 23/62* | (2006.01) | |
| *H01L 29/866* | (2006.01) | |
| *H01L 27/02* | (2006.01) | |
| *H01L 29/66* | (2006.01) | |
| *H01L 29/06* | (2006.01) | |

(52) U.S. Cl.
CPC ........ *H01L 29/866* (2013.01); *H01L 27/0255* (2013.01); *H01L 29/0649* (2013.01); *H01L 29/66106* (2013.01); *H01L 29/0692* (2013.01)

(58) Field of Classification Search
CPC ........... H01L 29/0692; H01L 29/66106; H01L 29/866; H01L 27/0255; H01L 29/0649
USPC ....................................................... 257/356
See application file for complete search history.

(56) References Cited

U.S. PATENT DOCUMENTS

| | | |
|---|---|---|
| 5,468,984 A | 11/1995 | Efland et al. |
| 5,856,214 A | 1/1999 | Yu |
| 6,831,334 B2 | 12/2004 | Okawa et al. |
| 8,252,656 B2 | 8/2012 | Whitfield et al. |
| 8,492,866 B1 | 7/2013 | Anderson et al. |
| 8,497,167 B1 | 7/2013 | Vashchenko et al. |
| 8,553,380 B2 | 10/2013 | Salcedo |
| 2008/0164556 A1* | 7/2008 | Kikuchi ............. H01L 27/0788 257/481 |
| 2008/0258263 A1 | 10/2008 | Gee et al. |
| 2012/0274668 A1* | 11/2012 | Nakamura ............ H01S 5/0427 345/690 |

FOREIGN PATENT DOCUMENTS

| | | |
|---|---|---|
| JP | 11-054708 | 2/1999 |
| JP | 2010-219438 | 9/2010 |

* cited by examiner

*Primary Examiner* — Trung Q Dang
*Assistant Examiner* — Patricia Reddington
(74) *Attorney, Agent, or Firm* — Ward and Smith, P.A.

(57) ABSTRACT

Provided are semiconductor devices. A semiconductor device includes a first well formed in a substrate; an element isolation layer formed on the first well; a second well formed in the first well on a first side of the element isolation layer; a third well formed in the second well, the third well has a higher concentration of impurities than the second well; a first electrode electrically connected to the third well; a fourth well formed in the first well on a second side of the element isolation layer; a fifth well formed in the fourth well, the fifth well has a different conductivity type from the fourth well; a second electrode electrically connected to the fifth well; and a sixth well overlapping the fourth well, the sixth well has a lower concentration of impurities than the fourth well.

18 Claims, 18 Drawing Sheets

1200

1300

1400

SEMICONDUCTOR DEVICES

This application claims priority from Korean Patent Application No. 10-2014-0098341 filed on Jul. 31, 2014 in the Korean Intellectual Property Office, the disclosure of which is incorporated herein by reference in its entirety.

BACKGROUND

As electronic goods become smaller and miniaturized, electrostatic discharge (ESD) can effect operating characteristics of an element. Therefore, various technologies are being researched to prevent ESD.

As one example of such technologies, a Zener diode is being used as an element for preventing ESD.

SUMMARY

Aspects of the present inventive concept provide semiconductor devices with improved operating characteristics.

Aspects of the present inventive concept include methods of fabricating a semiconductor device with improved operating characteristics.

However, aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

According to some embodiments of the present inventive concept, there is provided a semiconductor device including: a first well formed in a substrate; an element isolation layer formed on the first well; a second well formed in the first well on a first side of the element isolation layer; a third well formed in the second well, the third well has a higher concentration of impurities than the second well; a first electrode electrically connected to the third well; a fourth well formed in the first well on a second side of the element isolation layer; a fifth well formed in the fourth well, the fifth well has a different conductivity type from the fourth well; a second electrode electrically connected to the fifth well; and a sixth well overlapping the fourth well, the sixth well has a lower concentration of impurities than the fourth well.

According to some embodiments of the present inventive concept, there is provided a semiconductor device including: an n-channel metal oxide semiconductor (NMOS) transistor which has a gate electrode connected to an input terminal, a source electrode connected to a ground terminal, and a drain electrode connected to an output terminal; and a Zener diode which is connected between the gate electrode and the ground terminal, wherein the Zener diode comprises: an element isolation layer which is formed on a first well; a second well which is formed in the first well on a side of the element isolation layer; a third well which is formed in the second well and has a higher concentration of impurities than the second well; a first electrode which electrically connects the third well and the ground terminal; a fourth well which is formed in the first well on the other side of the element isolation layer; a fifth well which is formed in the fourth well and has a different conductivity type from the fourth well; a second electrode which electrically connects the fifth well and the gate electrode; and a sixth well which is formed under the element isolation layer to overlap the element isolation layer and has a lower concentration of impurities than the fourth well.

Some embodiments of the present inventive concept are directed to a semiconductor device that includes an element isolation layer that is on a first well in a substrate, a plurality of anode wells in the first well on a first side of the element isolation layer, a plurality of cathode wells in the first well on a second side of the element isolation layer that is different than the first side of the element isolation layer, a first electrode that is electrically connected to at least one of the plurality of anode wells, a second electrode that is electrically connected to at least one of the plurality of cathode wells and a first low impurity concentration well that partially overlaps the first well and a portion of one of the plurality of cathode wells.

In some embodiments, ones of the anode wells each comprise a P-type well, ones of which include different impurity concentrations than another one of the anode wells.

Some embodiments provide that the cathode wells include a first conductivity type well and a second conductivity type well that is different from the first conductivity type well.

Some embodiments include a second low impurity concentration well that partially overlaps the first well and a portion of one of the anode wells. The first low impurity concentration well is on a first side of a portion of the first well and the second low impurity concentration well is on a second side of the portion of the first well.

In some embodiments, the element isolation layer includes a first element isolation layer that is on a first side of the cathode wells and the anode wells include a first plurality of anode wells. Some embodiments further include a second element isolation layer in the first well and on a second side of the cathode wells. The cathode wells are on a first side of the second element isolation layer. Some embodiments include a second plurality of anode wells in the first well on a second side of the second element isolation layer that is different than the first side of the second element isolation layer.

BRIEF DESCRIPTION OF THE DRAWINGS

The above and other aspects and features of the present inventive concept will become more apparent by describing in detail example embodiments thereof with reference to the attached drawings.

DETAILED DESCRIPTION

Figure 1:
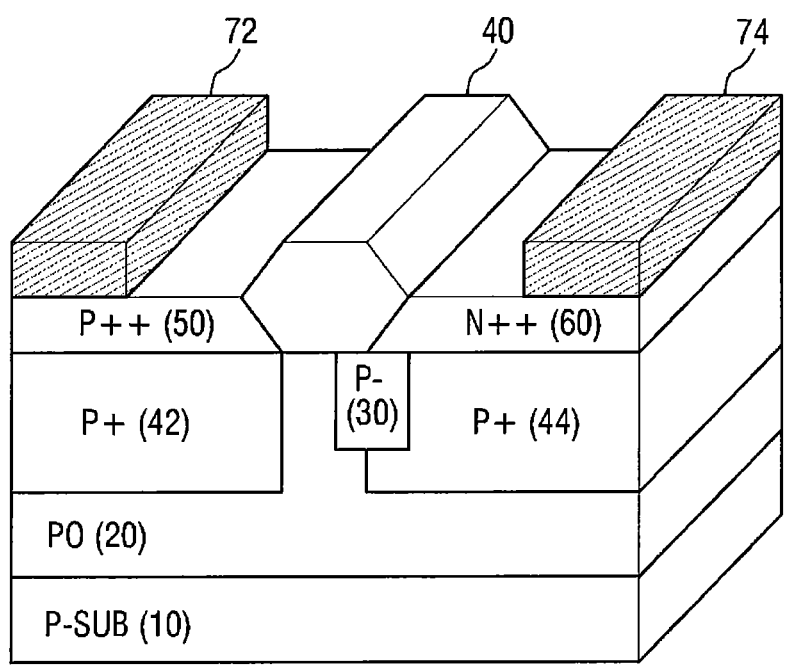
FIG. 1 is a partial perspective view of a semiconductor device according to some embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The present inventive concept will be described with reference to perspective views, cross-sectional views, and/or plan views, in which preferred embodiments of the inventive concept are shown. Thus, the profile of an example view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concept belongs. It is noted that the use of any and all examples, or example terms provided herein is intended merely to better illuminate the inventive concept and is not a limitation on the scope of the inventive concept unless otherwise specified. Further, unless defined otherwise, all terms defined in generally used dictionaries may not be overly interpreted.

FIG. 1 is a partial perspective view of a semiconductor device 1 according to some embodiments of the present inventive concept. Referring to FIG. 1, the semiconductor device 1 includes a substrate 10, a first well 20, a second well 42, a third well 50, a fourth well 44, a fifth well 60, a sixth well 30, an element isolation layer 40, a first electrode 72, and a second electrode 74.

The substrate 10 may be, for example, a bulk silicon substrate or a silicon-on-insulator (SOI) substrate. Otherwise, the substrate 10 may be a silicon substrate or may be a substrate made of another material such as silicon germanium, indium antimonide, lead telluride, indium arsenide, indium phosphide, gallium arsenide, and/or gallium antimonide, among others.

In some embodiments, the substrate 10 may consist of a base substrate and an epitaxial layer formed on the base substrate. In this case, the epitaxial layer may include an element semiconductor material such as silicon and/or germanium. In addition, the epitaxial layer may include a compound semiconductor such as a group IV-IV compound semiconductor or a group III-V compound semiconductor.

Specifically, the group IV-IV compound semiconductor that forms the epitaxial layer may be a binary or ternary compound containing two or more of carbon (C), silicon (Si), germanium (Ge) and/or tin (Sn) or a compound obtained by doping the binary or ternary compound with a group IV element.

The group III-V compound semiconductor that forms the epitaxial layer may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

In some embodiments, the substrate 10 may be, but is not limited to, a P-type substrate.

The first well 20 may be formed in the substrate 10. The first well 20 may be formed over the whole surface of the substrate 10 as illustrated in the drawing.

The first well 20 may have the same conductivity type as the substrate 10. That is, if the conductivity type of the substrate 10 is a P type, the conductivity type of the first well 20 may also be the P type. However, the present inventive concept is not limited thereto, and the conductivity types of the substrate 10 and the first well 20 can be changed as desired.

The element isolation layer 40 may be formed on the first well 20. The element isolation layer 40 may be made of a material including at least one of, but not limited to, a silicon oxide layer, a silicon nitride layer, and a silicon oxynitride layer.

In FIG. 1, the element isolation layer 40 has a hexagonal cross-sectional shape. However, the cross-sectional shape of the element isolation layer 40 is not limited to the hexagonal shape. That is, the cross-sectional shape of the element isolation layer 40 can be changed as desired.

The second well 42 may be formed in the first well 20 disposed on a side of the element isolation layer 40. In addition, the fourth well 44 may be formed in the first well 20 disposed on the other side of the element isolation layer 40.

The second well 42 and the fourth well 44 may be separated from each other by the element isolation layer 40, as illustrated in the drawing.

In some embodiments of the present inventive concept, the second well 42 and the fourth well 44 may have the same conductivity type. In addition, the second well 42 and the fourth well 44 may have the same conductivity type as the first well 20. For example, if the first well 20 has the P type, the second well 42 and the fourth well 44 may also have the P type.

The concentration of impurities in the second well 42 and the fourth well 44 may be higher than that of impurities in the first well 20.

The third well 50 may be formed in the second well 42, and the fifth well 60 may be formed in the fourth well 44.

In some embodiments of the present inventive concept, the third well 50 may have the same conductivity type as the second well 42, and the fifth well 60 may have a different conductivity type from the fourth well 44. Specifically, the conductivity type of the third well 50 may be the P type which is the same as the conductivity type of the second well 42, and the conductivity type of the fifth well 60 may be an N type which is different from the conductivity type of the fourth well 44.

However, the present inventive concept is not limited thereto, and the conductivity type of the third well 50 and the conductivity type of the fifth well 60 can be changed as desired.

In some embodiments of the present inventive concept, the concentration of impurities in the third well 50 may be higher than that of impurities in the second well 42. In addition, the concentration of impurities in the fifth well 60 may be higher than that of impurities in the fourth well 44. Accordingly, the third well 50 and the fifth well 60 can be used as a source region and a drain region during the operation of the semiconductor device 1 according to the some embodiments of the present inventive concept.

The first electrode 72 electrically connected to the third well 50 may be formed on the third well 50, and the second electrode 74 electrically connected to the fifth well 60 may be formed on the fifth well 60. In some embodiments of the present inventive concept, the first electrode 72 may be an anode, and the second electrode 74 may be a cathode.

The sixth well 30 may be formed under the element isolation layer 40. Specifically, the sixth well 30 may be formed in the first well 20 and the fourth well 44 under the element isolation layer 40 and may be overlapped by the element isolation layer 40 as illustrated in the drawing.

In FIG. 1, a portion of the sixth well 30 overlaps the fourth well 44, and the other portion of the sixth well 30 overlaps the first well 20, but the present inventive concept is not limited thereto.

In some embodiments, the sixth well 30 and the first well 20 may have the same conductivity type. For example, both the sixth well 30 and the first well 20 may have the P type.

Here, the concentration of impurities in the sixth well 30 may be lower than that of impurities in the first well 20. The concentration of impurities in the sixth well 30 is lower than that of impurities in the first well 20 because the sixth well 30 is formed by performing counter-implantation on the first well 20. This will be described in greater detail later in relation to methods of fabricating the semiconductor device 1 according to the current embodiments of the present inventive concept.

In some embodiments, the sixth well 30 and the fourth well 44 may have the same conductivity type. For example, both the sixth well 30 and the fourth well 44 may have the P type.

Here, the concentration of impurities in the sixth well 30 may be lower than that of impurities in the fourth well 44. In other words, the sixth well 30 may be a low concentration region compared with the fourth well 44.

If the semiconductor device 1 according to the current embodiments operates as a Zener diode, the sixth well 30 may improve operating characteristics of the semiconductor device 1. This will now be described in greater detail with reference to FIG. 2.

Figure 2:
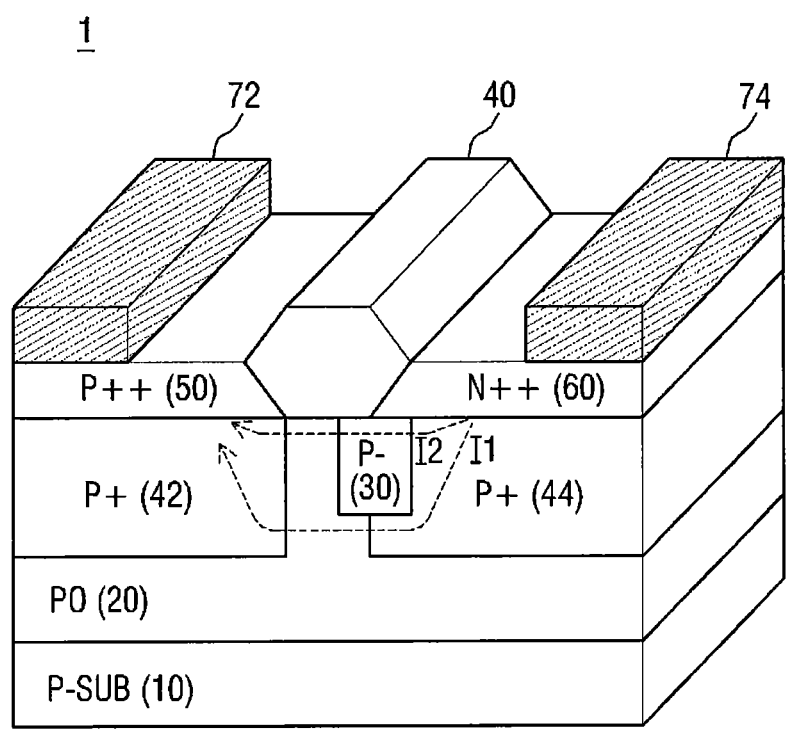
FIG. 2 is a view illustrating the operation of the semiconductor device of FIG. 1.
Figure 2:
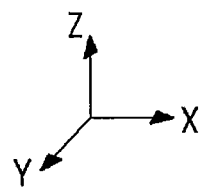

FIG. 2 is a view illustrating the operation of the semiconductor device 1 of FIG. 1. Referring to FIG. 2, when the semiconductor device 1 according to some embodiments operates, an electric current may flow along a path I1 by making a detour around the sixth well 30 due to the effect of the sixth well 30.

On the other hand, without the sixth well 30, the electric current may flow along an interface of the substrate 10 as indicated by reference character 12. If the electric current flows along the interface of the substrate 10, current crowding may occur at a contact surface between the substrate 10 made of, e.g., silicon and the element isolation layer 40 made of, e.g., an oxide layer.

Current crowding can make the contact surface between the substrate 10 (made of, e.g., silicon) and the element isolation layer 40 (made of, e.g., an oxide layer) very unstable, thereby degrading operating characteristics of a semiconductor device.

However, the semiconductor device 1 according to some embodiments includes the sixth well 30 which is a low concentration region. Therefore, when the semiconductor device 1 operates, the electric current flows along the path I1 away from the interface of the substrate 10 by making a detour around the sixth well 30. Consequently, this can solve the problem of degradation of operating characteristics.

Figure 3:
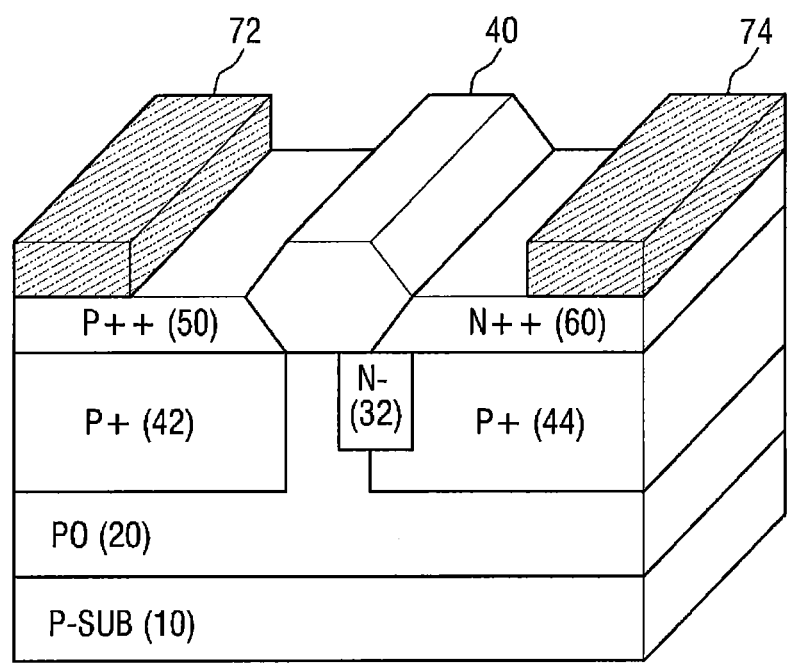
FIG. 3 is a partial perspective view of a semiconductor device according to some embodiments of the present inventive concept.
Figure 3:
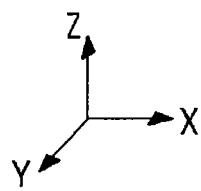

FIG. 3 is a partial perspective view of a semiconductor device 2 according to some embodiments of the present inventive concept. For simplicity, a redundant description of elements identical to those of the above-described embodiments will be omitted, and the current embodiments will hereinafter be described, focusing mainly on differences with the above-described embodiments.

Referring to FIG. 3, in the semiconductor device 2, a sixth well 32 may have a different conductivity type from the sixth well 30 (see FIG. 1) described above. That is, in some embodiments, the conductivity type of the sixth well 32 may be different from that of a fourth well 44. Specifically, the conductivity type of the sixth well 32 may be an N type, and the conductivity type of the fourth well 44 may be a P type.

The sixth well 32 may be formed by performing additional counter-implantation on the sixth well 30 (see FIG. 1). However, the present inventive concept is not limited thereto, and the methods of forming the sixth well 32 can be changed as desired.

The conductivity type of the sixth well 32 and the conductivity type of the fourth well 44 are not limited to those illustrated in FIG. 2. If necessary, the conductivity type of the sixth well 32 and the conductivity type of the fourth well 44 can be reversed.

The concentration of impurities in the sixth well 32 may be lower than that of impurities in a fifth well 60.

In addition, the concentration of impurities in the sixth well 32 may be lower than that of impurities in the fourth well 44. That is, the sixth well 32 may be a low concentration region compared with the fourth well 44.

Accordingly, when the semiconductor device 2 operates, an electric current may flow along a path away from an interface of a substrate 10 by making a detour around the sixth well 32. Therefore, operating characteristics of the semiconductor device 2 can be improved.

Figure 4:
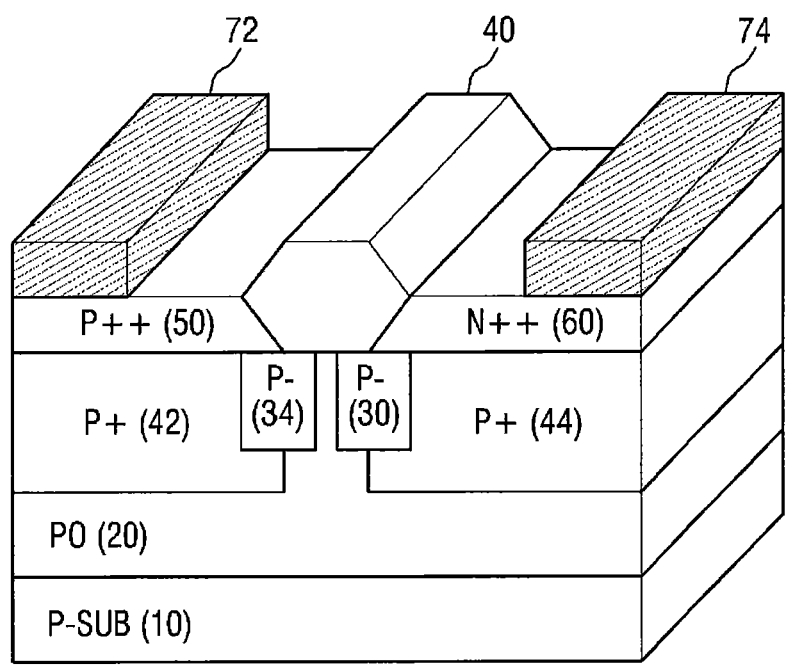
FIG. 4 is a partial perspective view of a semiconductor device according to some embodiments of the present inventive concept.
Figure 4:
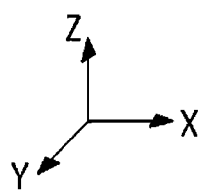

FIG. 4 is a partial perspective view of a semiconductor device 3 according to some embodiments of the present inventive concept. For simplicity, a redundant description of elements identical to those of the above-described embodiments will be omitted, and the current embodiments will hereinafter be described, focusing mainly on differences with the above-described embodiments.

Referring to FIG. 4, the semiconductor device 3 may further include a seventh well 34. The seventh well 34 may overlap a second well 42 but may be separated from a sixth well 30.

In some embodiments of the present inventive concept, the seventh well 34 may have the same conductivity type as the sixth well 30. In addition, the seventh well 34 may have the same conductivity type as the second well 42. Specifically, all of the second well 42, the sixth well 30 and the seventh well 34 may have a P type.

However, the present inventive concept is not limited thereto, and the semiconductor device 2 described above can also be modified in a similar manner. Specifically, in some other embodiments of the present inventive concept, the seventh well 34 may have the same conductivity type as the sixth well 30 but may have a different conductivity type from the second well 42. Specifically, the second well 42 may have the P type, but the sixth well 30 and the seventh well 34 may have an N type.

The concentration of impurities in the seventh well 34 may be lower than that of impurities in the second well 42. That is, the seventh well 34 may be a low concentration region compared with the second well 42.

Accordingly, when the semiconductor device 3 operates, an electric current may flow along a path away from an interface of a substrate 10 by making a detour around the sixth well 32 and the seventh well 34. Therefore, operating characteristics of the semiconductor device 3 can be improved.

Figure 5:
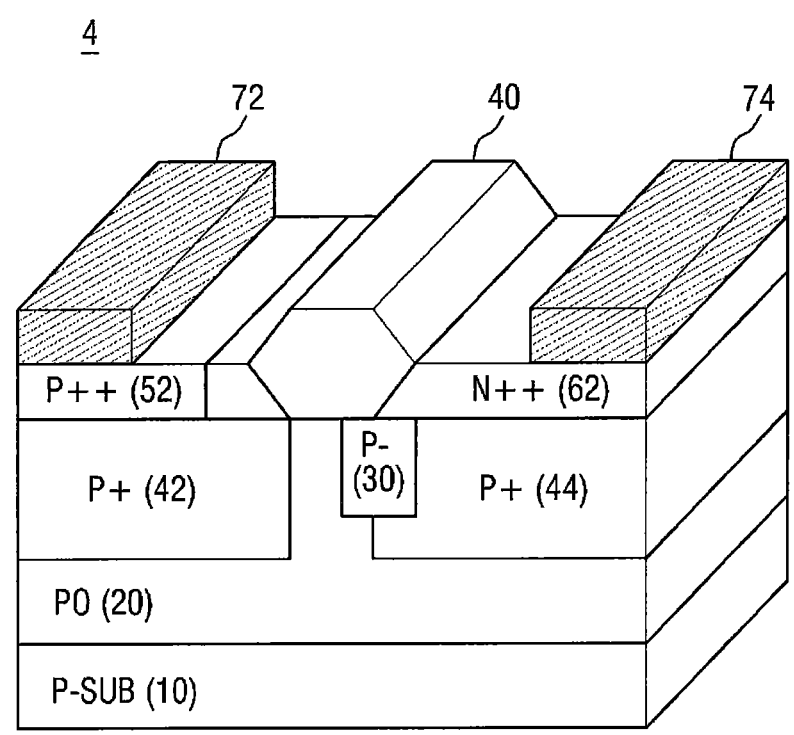
FIG. 5 is a partial perspective view of a semiconductor device according to some embodiments of the present inventive concept.

FIG. 5 is a partial perspective view of a semiconductor device 4 according to some embodiments of the present inventive concept. For simplicity, a redundant description of elements identical to those of the above-described embodiments will be omitted, and the current embodiments will hereinafter be described, focusing mainly on differences with the above-described embodiments.

Referring to FIG. 5, a fifth well 62 of the semiconductor device 4 may extend further toward a side (e.g., an X direction) of an element isolation layer 40. In other words, the element isolation layer 40 may not serve as a boundary that divides a third well 52 and the fifth well 62. Instead, the boundary between the third well 52 and the fifth well 62 may be formed on a side of the element isolation layer 40 as illustrated in the drawing.

Accordingly, part of the fifth well 62 may be formed within a second well 42. In addition, the fifth well 62 may entirely overlap the device isolation layer 40.

The fifth well 52 formed on a side (e.g., a left side of FIG. 5) of the element isolation layer 40 may be a floating region. Thus, when the semiconductor device 4 operates, the fifth well 52 may disperse the flow of an electric current from an interface of a substrate 10. Accordingly, operating characteristics of the semiconductor device 4 can be improved.

Figure 6:
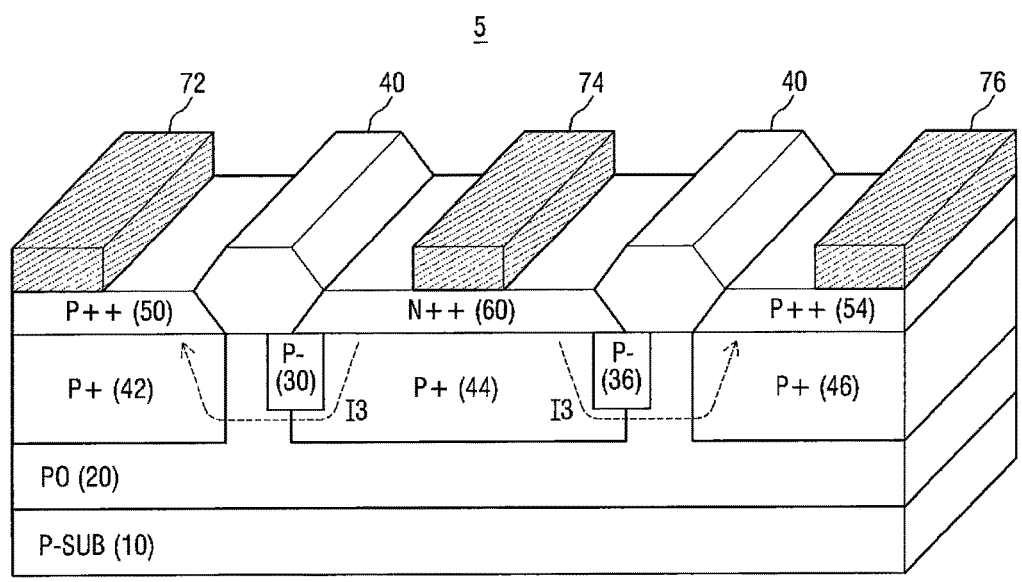
FIG. 6 is a partial perspective view of a semiconductor device according to some embodiments of the present inventive concept.
Figure 7:
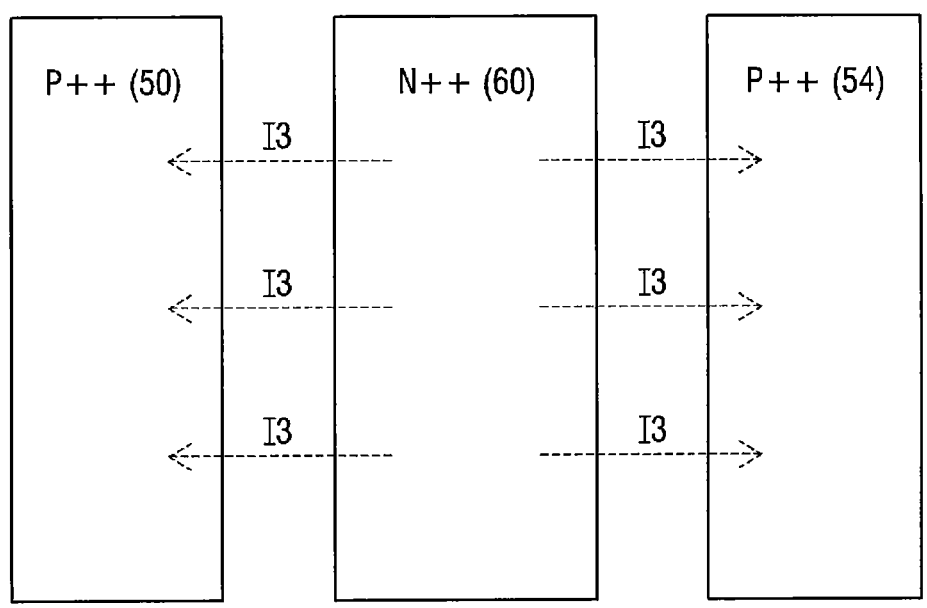
FIG. 7 is a vertical cross-sectional view of a third well, a fifth well and a ninth well of the semiconductor device illustrated in FIG. 6.

FIG. 6 is a partial perspective view of a semiconductor device 5 according to some embodiments of the present inventive concept. FIG. 7 is a vertical cross-sectional view of a third well 50, a fifth well 60 and a ninth well 54 of the semiconductor device 5 illustrated in FIG. 6. For simplicity, a redundant description of elements identical to those of the above-described embodiments will be omitted, and the current embodiments will hereinafter be described, focusing mainly on differences with the above-described embodiments.

Referring to FIGS. 6 and 7, the semiconductor device 5 may further include eighth, ninth and tenth wells 46, 54 and 36. The eighth well 46 formed on a second side of a fourth well 44 may be substantially identical to the second well 42, and the ninth well 54 which is formed in the eighth well 46 and has a higher concentration of impurities than the eighth well 46 may be substantially identical to the third well 50.

That is, the third well 50 and the ninth well 54 identical to each other may be formed on both sides of the fifth well 60, and the second well 42 and the eighth well 46 identical to each other may be formed on both sides of the fourth well 44.

A third electrode 76 electrically connected to the ninth well 54 may be formed on the ninth well 54.

The tenth well 36 may overlap the fourth well 44 and have a lower concentration of impurities than the fourth well 44.

The tenth well 36 may be substantially identical to a sixth well 30. That is, the sixth well 30 and the tenth well 36 identical to each other may be formed on both sides of the fourth well 44. Accordingly, part of the sixth well 30 may overlap a first side of the fourth well 44, and part of the tenth well 36 may overlap the second side of the fourth well 44.

The third well 50, the fifth well 60, and the ninth well 54 may extend side by side with one another along a direction (e.g., a Y direction) as illustrated in the drawings. Accordingly, when the semiconductor device 5, an electric current may flow along a path 13 away from an interface of a substrate 10 by making a detour around each of the sixth well 30 and the tenth well 36. The path 13 may be formed in right and left directions as illustrated in FIGS. 6 and 7.

Accordingly, more current can flow without current crowding, thereby improving operating characteristics of the semiconductor device 5.

Figure 8:
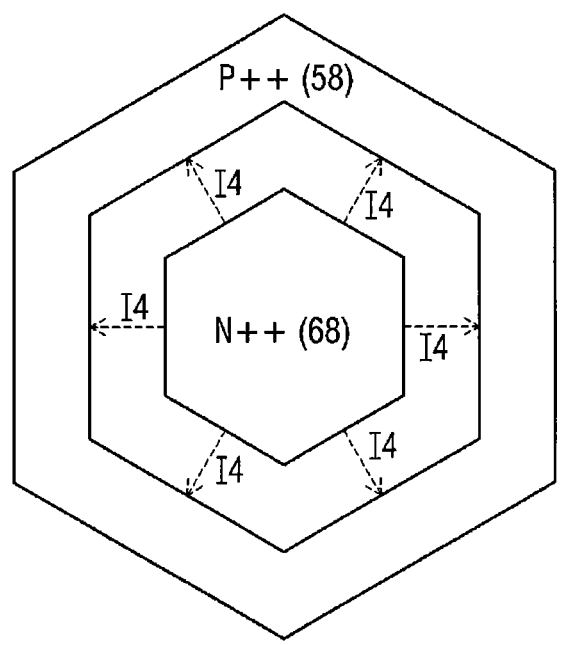
FIG. 8 is a vertical cross-sectional view of wells of a semiconductor device according to some embodiments of the present inventive concept.

FIG. 8 is a vertical cross-sectional view of wells of a semiconductor device 6 according to some embodiments of the present inventive concept. For simplicity, a redundant description of elements identical to those of the above-described embodiments will be omitted, and the current embodiments will hereinafter be described, focusing mainly on differences with the above-described embodiments.

Referring to FIG. 8, a fifth well 68 and a third well 58 of the semiconductor device 6 according to some embodiments may have different vertical cross-sectional shapes from those of the semiconductor devices 1 through 5 described above.

Specifically, in the semiconductor device 6 according to some embodiments, the vertical cross section of the fifth well 68 may be hexagonal, and the vertical cross section of the third well 58 may be shaped to surround the fifth well 68.

In the semiconductor device 6 according to some embodiments of the present inventive concept, an electric current may flow along a path 14 formed in six directions according to the shape of the fifth well 68 and the shape of the third well 58. Accordingly, operating characteristics of the semiconductor device 6 can be improved.

Figure 9:
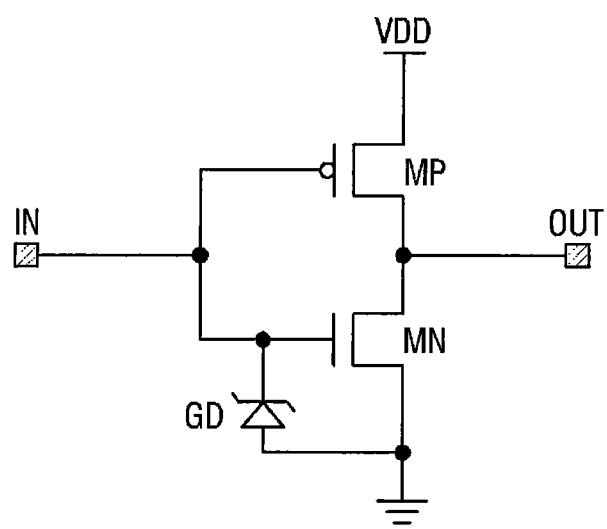
FIG. 9 is a circuit diagram of a semiconductor device according to some embodiments of the present inventive concept.

FIG. 9 is a circuit diagram of a semiconductor device 7 according to some embodiments of the present inventive concept. For simplicity, a redundant description of elements identical to those of the above-described embodiments will be omitted, and the current embodiments will hereinafter be described, focusing mainly on differences with the above-described embodiments.

Referring to FIG. 9, the semiconductor device 7 includes a p-channel metal oxide semiconductor (PMOS) transistor MP, an n-channel metal oxide semiconductor (NMOS) transistor MN, and a Zener diode GD.

The PMOS transistor MP may have a source electrode connected to a power source terminal VDD, a gate electrode connected to an input terminal IN, and a drain electrode connected to an output terminal OUT.

The NMOS transistor MN may have a source electrode connected to a ground terminal, a gate electrode connected to the input terminal IN, and a drain electrode connected to the output terminal OUT.

In some embodiments of the present inventive concept, the PMOS transistor MP and the NMOS transistor MN may form, but are not limited to, an inverter.

In some embodiments of the present inventive concept, the inverter may be employed as an element of, but is not limited to, a logic circuit.

A cathode of the Zener diode GD may be connected to the gate electrode of the NMOS transistor MN, and an anode of the Zener diode GD may be connected to the ground terminal as illustrated in the drawing.

In some embodiments, when an electrostatic discharge (ESD) occurs at the input terminal IN, the Zener diode GD may be function as an ESD element that is turned on in a reverse direction by a high voltage input to the input terminal IN so as to flow the high voltage of the input terminal IN to the ground terminal.

At least one of the semiconductor devices 1 through 6 according to the above-described embodiments of the present inventive concept can be employed as an element of the Zener diode GD.

Figure 10:
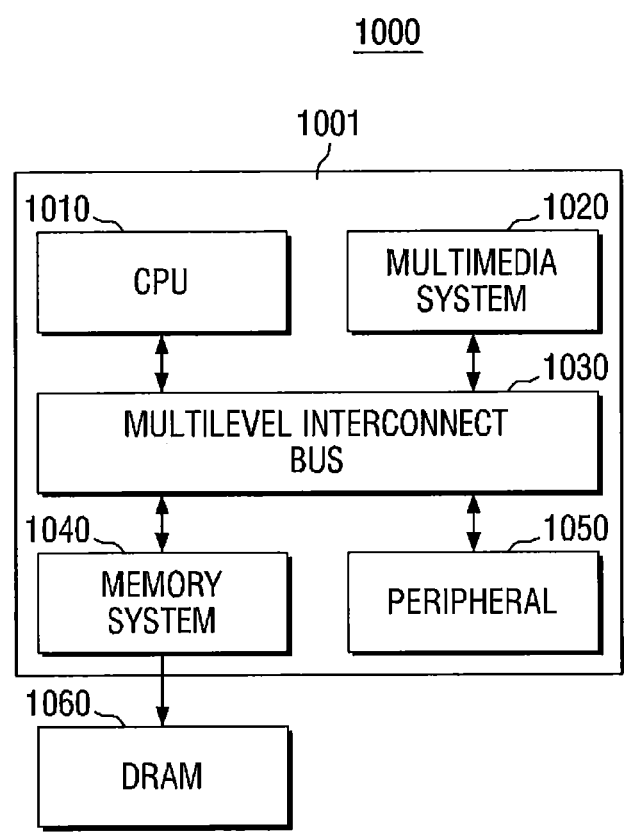
FIG. 10 is a block diagram of a system-on-chip (SoC) system including semiconductor devices according to some embodiments of the present inventive concept.

FIG. 10 is a block diagram of a system-on-chip (SoC) system 1000 including semiconductor devices according to some embodiments of the present inventive concept. Referring to FIG. 10, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations needed to drive the SoC system 1000. In some embodiments of the present inventive concept, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, a post-processor, etc.

The bus 1030 may be used for data communication among the CPU 1010, the multimedia system 1020, the memory system 1040 and the peripheral circuit 1050. In some embodiments of the present inventive concept, the bus 1030 may have a multilayer structure. Specifically, the bus 1030 may be, but is not limited to, a multilayer advanced high-performance bus (AHB) and/or a multilayer advanced extensible interface (AXI).

The memory system 1040 may provide an environment needed for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment needed for the SoC system 1000 to smoothly connect to an external device (e.g., mainboard). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In some embodiments, the DRAM 1060 may be placed outside the application processor 1001 as illustrated in the drawing. Specifically, the DRAM 1060 may be packaged with the application processor 1001 in the form of package on package (PoP).

At least one of the elements of the SoC system 1000 may include any one of the semiconductor devices 1 through 7 according to the above-described embodiments of the present inventive concept.

Figure 11:
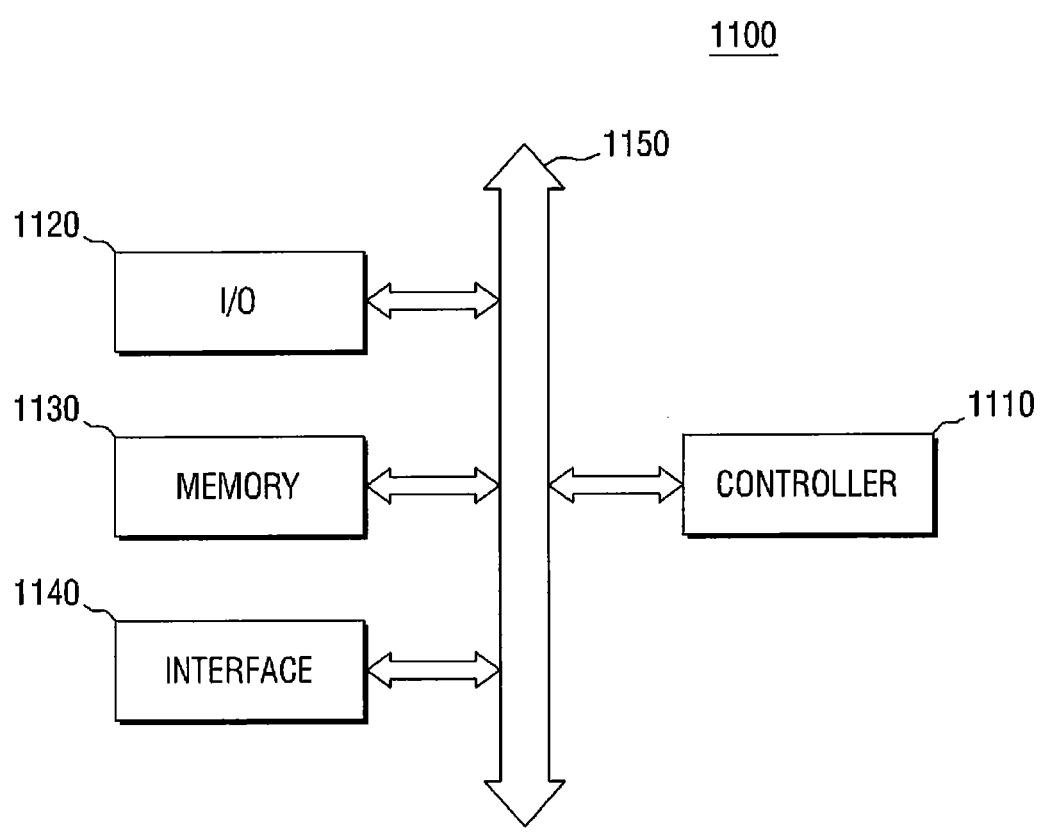
FIG. 11 is a block diagram of an electronic system including semiconductor devices according to some embodiments of the present inventive concept.

FIG. 11 is a block diagram of an electronic system 1100 including semiconductor devices according to embodiments of the present inventive concept. Referring to FIG. 11, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and/or a microcontroller. The I/O device 1120 may include a keypad, a keyboard and/or a display device. The memory device 1130 may store data and/or commands. The interface 1140 may be used to transmit data to and/or receive data from a communication network. The interface 1140 may be a wired and/or wireless interface. In an example, the interface 1140 may include an antenna and/or a wired or wireless transceiver.

Although not illustrated in the drawing, the electronic system 1100 may be an operating memory for improving the operation of the controller 1110, and may further include a high-speed DRAM or static random access memory (SRAM).

The electronic system 1100 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

At least one of the elements of the electronic system 1100 may include any one of the semiconductor devices 1 through 7 according to the above-described embodiments of the present inventive concept.

Figure 12:
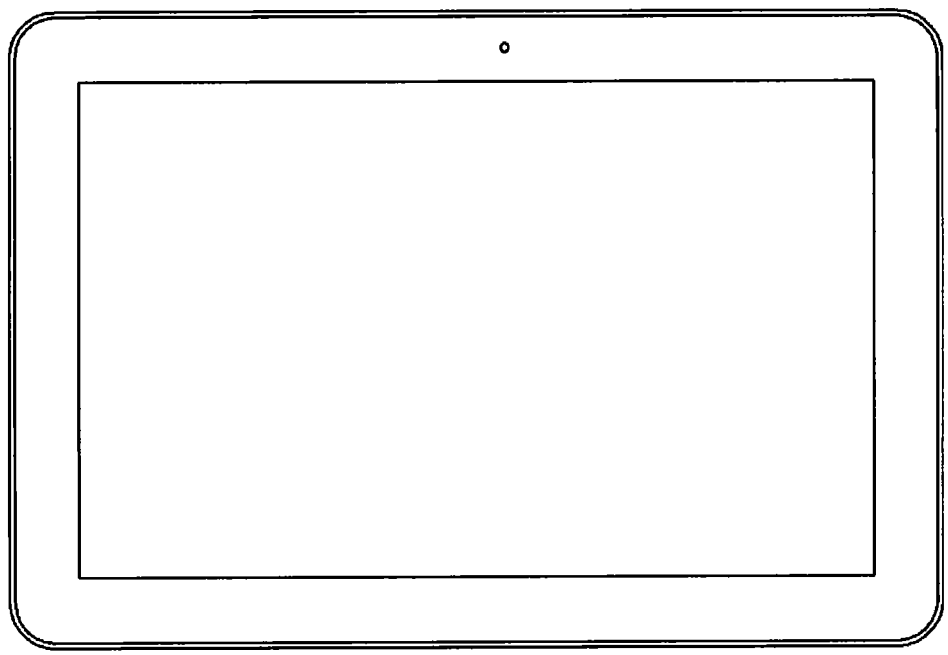
FIGS. 12 through 14 are diagrams illustrating examples of a semiconductor system to which semiconductor devices according to some embodiments of the present inventive concept can be applied.
Figure 13:
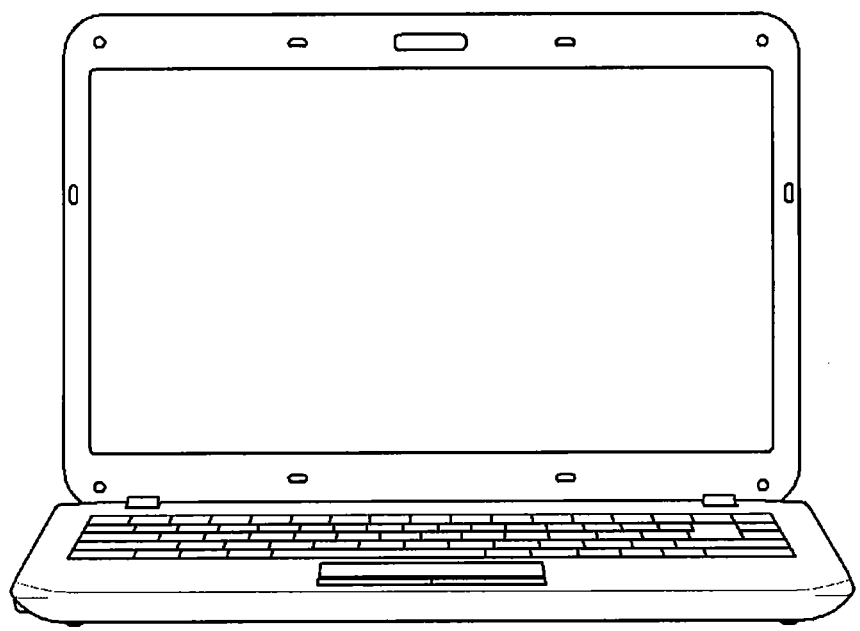
Figure 14:
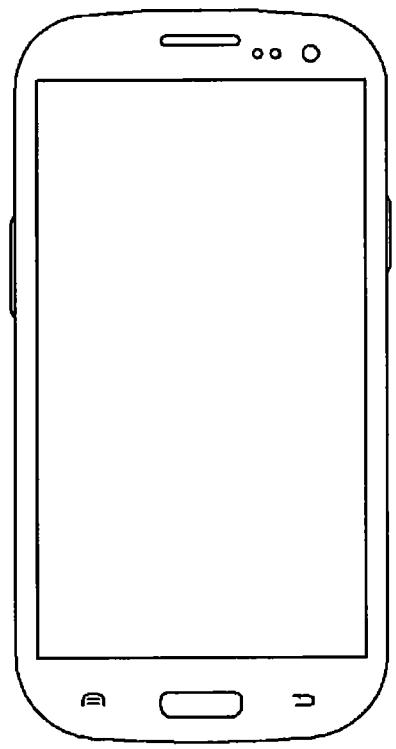

FIGS. 12 through 14 are diagrams illustrating examples of a semiconductor system to which semiconductor devices according to embodiments of the present inventive concept can be applied.

FIG. 12 illustrates a tablet personal computer (PC) 1200, FIG. 13 illustrates a notebook computer 1300, and FIG. 14 illustrates a smartphone 1400. At least one of the semiconductor devices according to the above-described embodiments of the present inventive concept, as set forth herein, may be used in the tablet PC 1200, the notebook computer 1300, and the smartphone 1400.

The semiconductor devices according to the embodiments of the present inventive concept, as set forth herein, may also be applied to various IC devices other than those set forth herein. That is, while the tablet PC 1200, the notebook computer 1300, and the smartphone 1400 have been described above as examples of the semiconductor system according to some embodiments of the present inventive concept, the examples of the semiconductor system according to such embodiments are not limited to the tablet PC 1200, the notebook computer 1300, and the smartphone 1400. In some embodiments of the present inventive concept, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

FIGS. 15 through 18 are views illustrating operations of methods of fabricating a semiconductor device according to some embodiments of the present inventive concept.

Figure 15:
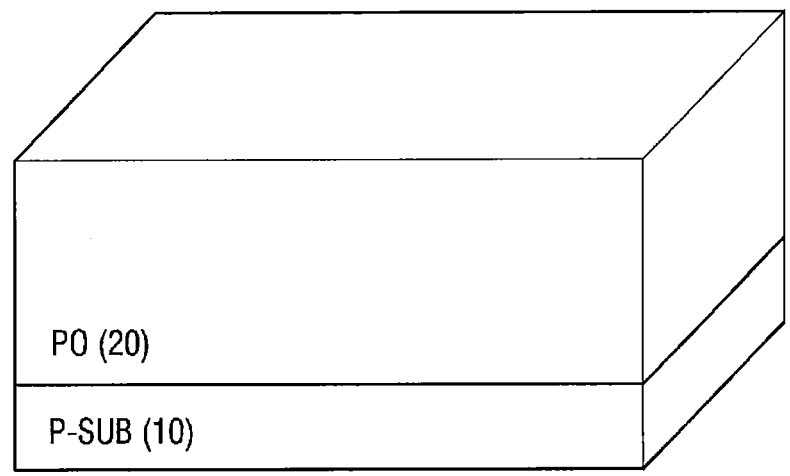
FIGS. 15 through 18 are views illustrating operations in methods of fabricating a semiconductor device according to some embodiments of the present inventive concept.
Figure 15:
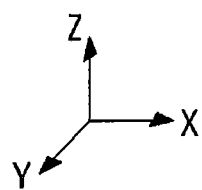

Referring to FIG. 15, a first well 20 is formed in a substrate 10.

In some embodiments of the present inventive concept, the substrate 10 may include a P-type substrate, and the first well 20 may be formed by injecting P-type impurities into the whole surface of the P-type substrate 10. However, the present inventive concept is not limited thereto, and the conductivity types of the substrate 10 and the first well 20 can be changed as desired.

Figure 16:
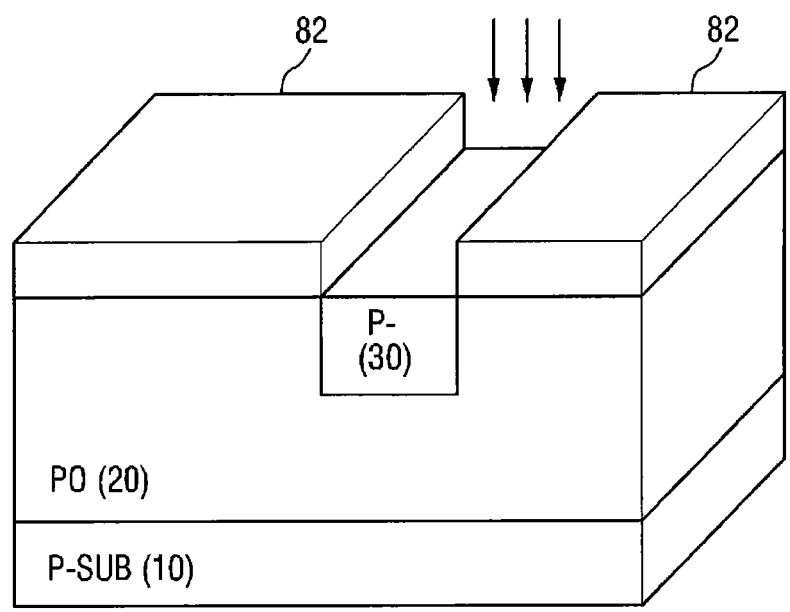
Figure 16:
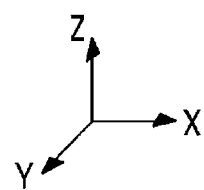

Referring to FIG. 16, a mask 82 is formed on the first well 20 to expose a portion of a top surface of the first well 20.

Then, a sixth well 30 is formed by performing counter-implantation. Specifically, impurities of a conductivity type different from the conductivity type of the first well 20 are injected from the exposed portion of the top surface of the first well 20, thereby forming the sixth well 30.

Accordingly, the concentration of impurities in the sixth well 30 may be lower than that of impurities in the first well 20.

In some embodiments of the present inventive concept, a sixth well 32 (see FIG. 3) of a conductivity type different from the conductivity type of the first well 20 may be formed by counter-implantation. Specifically, if the conductivity type of the first well 20 is a P type, N-type impurities of a first concentration may be injected into the first well 20 to form a P-type sixth well 30 having a lower concentration of impurities than the first well 20, and N-type impurities of a second concentration higher than the first concentration may be injected into the first well 20 to form an N-type sixth well 32 (see FIG. 3) having a different conductivity type from the first well 20.

Figure 17:
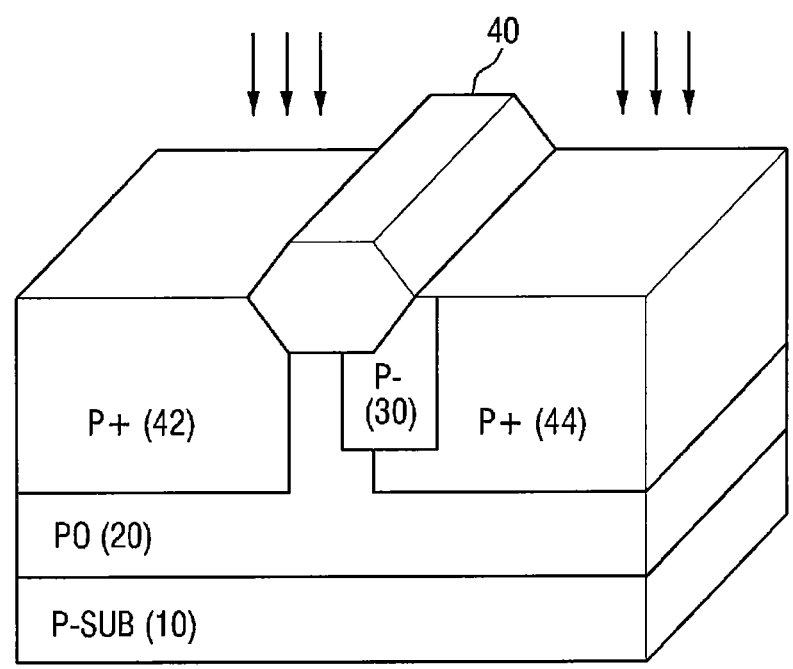

Referring to FIG. 17, an element isolation layer 40 is formed on the first well 20. Here, the element isolation layer 40 may be formed on a recess formed in the top surface of the first well 20 and a top surface of the sixth well 30.

Then, P-type impurities are injected into the first well 20 using the element isolation layer 40 as a mask, thereby forming a second well 42 on a side of the element isolation layer 40 and a fourth well 44 on the other side of the element isolation layer 40. Accordingly, the second well 42 and the fourth well may be separated from each other as illustrated in the drawing.

The concentration of impurities in the second well 42 and the concentration of impurities in the fourth well 44 may be higher than that of impurities in the first well 20. In addition, the concentration of impurities in the second well 42 may be substantially equal to that of impurities in the fourth well 44.

Figure 18:
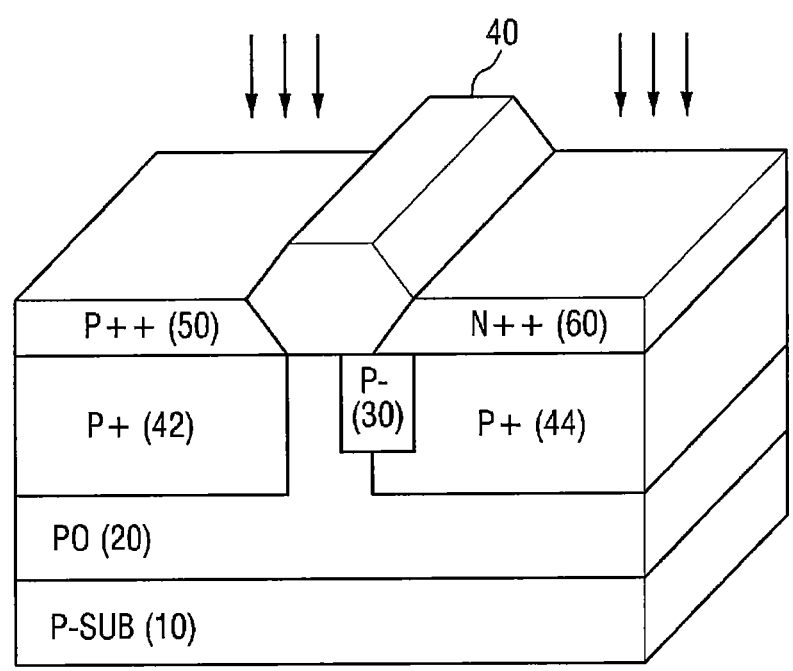
Figure 18:
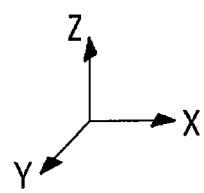

Referring to FIG. 18, a third well 50 is formed by injecting P-type impurities into the second well 42 using the element isolation layer 40 as a mask. In addition, a fifth well 60 is formed by injecting N-type impurities into the fourth well 44 using the element isolation layer 40 as a mask.

Here, since the third well 50 and the fifth well 60 respectively serve as a source region and a drain region when a semiconductor device operates, they may have higher concentrations of impurities than other wells.

A first electrode 72 (see FIG. 1) is formed on the third well 50, and a second electrode 74 (see FIG. 1) is formed on the fifth well 60. As a result, the semiconductor device 1 of FIG. 1 can be fabricated.

If the shape of the mask 82 is changed in the process of FIG. 16, the semiconductor device 3 of FIG. 4 can be fabricated.

In the process of FIG. 18, if impurities are injected using a mask that covers the element isolation layer 40, the fifth well 60, and part of the third well 50, the third well 52 of the semiconductor device 4 of FIG. 5 can be formed. In addition, if impurities are injected using a mask that covers only part of the third well 50, the fifth well 62 of the semiconductor device 4 of FIG. 5 can be formed.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:
1. A semiconductor device comprising:
a first well in a substrate;
a second well of a first conductivity type in the first well;
a third well of the first conductivity type in the second well and having a higher concentration of impurities of the first conductivity type than the second well;
a first electrode electrically connected to the third well;

a fourth well of the first conductivity type in the first well and spaced apart from the second well;
a fifth well of a second conductivity type in the fourth well;
a second electrode electrically connected to the fifth well;
an element isolation layer on the substrate between the second well and the fourth well; and
a sixth well in the substrate between the second well and the fourth well, overlapping the fourth well, shallower than the fourth well and having a lower concentration of impurities of the first conductivity type than the fourth well.

2. The semiconductor device of claim 1, wherein the sixth well and the element isolation layer overlap.

3. The semiconductor device of claim 1, wherein the sixth well has the first conductivity type.

4. The semiconductor device of claim 1, wherein the sixth well has the second conductivity type.

5. The semiconductor device of claim 4, wherein the concentration of impurities of the second conductivity type in the sixth well is lower than that of impurities of the second conductivity type in the fifth well.

6. The semiconductor device of claim 1, further comprising a seventh well in the substrate between the fourth well and the second well, shallower than the second well and having a lower concentration of impurities of the first conductivity type than the second well.

7. The semiconductor device of claim 6, wherein the sixth well and the seventh well are separated from each other.

8. The semiconductor device of claim 1, wherein part of the fifth well is formed in the fourth well.

9. The semiconductor device of claim 1, wherein the element isolation layer comprises a first element isolation layer, wherein the second well is on a first side of the fourth well and further comprising:
an eighth well of the first conductivity type in the first well on a second side of the fourth well;
a ninth well of the first conductivity type in the eighth well and having a higher concentration of impurities of the first conductivity type than the eighth well;
a second element isolation layer on the substrate between the fourth well and the eighth well; and
a tenth well in the substrate between the fourth well and the eighth well, shallower than the fourth well and having a lower concentration of impurities of the first conductivity type than the fourth well.

10. The semiconductor device of claim 1, wherein a vertical cross section of the fifth well is hexagonal, and a vertical cross section of the third well is shaped to surround the fifth well.

11. The semiconductor device of claim 1, wherein the first well has the first conductivity type, and the concentration of impurities of the first conductivity type in the first well is higher than that of impurities of the first conductivity type in the sixth well.

12. The semiconductor device of claim 1 being a Zener diode, wherein the first electrode comprises an anode, and the second electrode comprises a cathode.

13. A semiconductor device comprising:
an n-channel metal oxide semiconductor (NMOS) transistor having a gate electrode connected to an input terminal, a source electrode connected to a ground terminal, and a drain electrode connected to an output terminal; and
a Zener diode connected between the gate electrode and the ground terminal,
wherein the Zener diode comprises:
an element isolation layer on a first well in a substrate;
a second well of a first conductivity type in the first well on a first side of the element isolation layer;
a third well in the second well and having a higher concentration of impurities of the first conductivity type than the second well;
a first electrode that electrically connects the third well and the ground terminal;
a fourth well of the first conductivity type in the first well on a second side of the element isolation layer;
a fifth well of a second conductivity type in the fourth well;
a second electrode that electrically connects the fifth well and the gate electrode; and
a sixth well in the substrate between the second well and the fourth well, overlapping the fourth well, shallower than the fourth well and having a lower concentration of impurities of the first conductivity type than the fourth well.

14. A semiconductor device comprising:
an element isolation layer on a first well in a substrate;
a plurality of anode wells in the first well on a first side of the element isolation layer;
a plurality of cathode wells in the first well on a second side of the element isolation layer that is different than the first side of the element isolation layer;
a first electrode electrically connected to at least one of the plurality of anode wells;
a second electrode electrically connected to at least one of the plurality of cathode wells; and
a low impurity concentration well of a first conductivity type in the substrate between the plurality of anode wells and one of the plurality of cathode wells having the first conductivity type, in contact with the one of the plurality of cathode wells, having a lower concentration of impurities of the first conductivity type than the one of the plurality of cathode wells, and shallower than the one of the plurality of cathode wells.

15. The semiconductor device according to claim 14, wherein the plurality of anode wells consists of P-type wells that include different impurity concentrations.

16. The semiconductor device according to claim 14, wherein the plurality of cathode wells comprises the one of the plurality of cathode wells having the first conductivity type and a second conductivity type well.

17. The semiconductor device according to claim 14, wherein the low impurity concentration well comprises a first low impurity concentration well and further comprising:
a second low impurity concentration well disposed in the substrate between the first low impurity concentration well and the plurality of anode wells and shallower than the plurality of anode wells, and
wherein the first low impurity concentration well is on a first side of a portion of the first well and the second low impurity concentration well is on a second side of the portion of the first well.

18. The semiconductor device according to claim 14, wherein the element isolation layer comprises a first element isolation layer on a first side of the plurality of cathode wells, and
wherein the plurality of anode wells comprises a first plurality of anode wells on a first side of the plurality of cathode wells, and
wherein the low impurity concentration well comprises a first low impurity concentration well between the first plurality of anode wells and the plurality of cathode wells, the device further comprising:

a second element isolation layer on the first well on a second side of the plurality of cathode wells, the plurality of cathode wells on a first side of the second element isolation layer;

a second plurality of anode wells in the first well on a second side of the second element isolation layer; and a second low impurity concentration well in the substrate between the plurality of cathode wells and the second plurality of anode wells and shallower than the plurality of cathode wells.

* * * * *